United States Patent
Patel et al.

(10) Patent No.: US 6,891,435 B2
(45) Date of Patent: May 10, 2005

(54) SYSTEM AND METHOD FOR REDUCING SECOND ORDER DISTORTION IN ELECTRONIC CIRCUITS

(75) Inventors: Girish Patel, McKinney, TX (US); James M. Douglass, Carrollton, TX (US)

(73) Assignee: Microtune (Texas), L.P., Plano, TX (US)

( * ) Notice: Subject to any disclaimer, the term of this patent is extended or adjusted under 35 U.S.C. 154(b) by 119 days.

(21) Appl. No.: 10/319,067

(22) Filed: Dec. 13, 2002

(65) Prior Publication Data

US 2004/0113690 A1 Jun. 17, 2004

(51) Int. Cl.[7] .............................. H03F 3/45; H03F 1/26
(52) U.S. Cl. ..................... 330/254; 330/149; 330/258
(58) Field of Search .................. 330/254, 258, 330/149

(56) References Cited

U.S. PATENT DOCUMENTS

| | | | | |
|---|---|---|---|---|
| 5,225,790 A | * | 7/1993 | Noguchi et al. | 330/260 |
| 5,444,579 A | * | 8/1995 | Klein et al. | 360/67 |
| 5,557,238 A | * | 9/1996 | Weiss | 330/258 |
| 5,587,689 A | * | 12/1996 | Bowers | 330/254 |
| 6,404,285 B1 | | 6/2002 | Shkap | |
| 2003/0214356 A1 | | 11/2003 | Cowley et al. | |

OTHER PUBLICATIONS

International Search Report issued for PCT/US 03/39099, dated, Apr. 19, 2004.

* cited by examiner

*Primary Examiner*—Patricia Nguyen
(74) *Attorney, Agent, or Firm*—Fulbright & Jaworski LLP

(57) ABSTRACT

System and methods for reducing the effects of imbalance between input signals in a gain controlled differential amplifier are shown. Distortion in the amplifier is reduced by modulating the gain control input based upon detected differences between the signal levels of the differential input signal source.

66 Claims, 1 Drawing Sheet

US 6,891,435 B2

SYSTEM AND METHOD FOR REDUCING SECOND ORDER DISTORTION IN ELECTRONIC CIRCUITS

TECHNICAL FIELD

This invention relates in general to reducing second order distortion in electronic circuits more particularly to systems and methods for reducing the effects imbalances between differential input signals to gain-controlled amplifier circuits.

BACKGROUND

One method of reducing second order distortions in electronic circuitry is to use a differential amplifier. In order to use a differential amplifier there must be differential (at least two) signals coming into the amplifier circuitry. Unfortunately, differential signals do not usually come to a circuit from external sources. The signals that typically arrive at a device from external sources are single-ended signals. A balun, which is a balance transformer, converts the single-ended signal to a differential signal. Baluns are relatively expensive, have bulk and do not always provide a balanced output. In some instances, the output of the balun is not fully differential. These "non perfect" balun outputs then cause problems, such as second order distortion, in the amplifier.

BRIEF SUMMARY

It has been found that a primary cause of second order distortion in electronic circuits, and particularly in differential amplifiers, is due to signal imbalances. These imbalances can be either mismatches within the circuit itself or could be caused by imbalances in the applied input signal. In one embodiment, concepts of the present invention are applied to a variable gain amplifier which has its gain adjusted under control of an adjustment signal applied to one input of the amplifier. The adjustment signal may be provided, for example, through use of a variable resistor whose value is controlled by an externally applied gain control signal. It has been determined that such a variable resistor is a dominant source of second order distortion because the value of the resistor changes based on the input signals. By taking what is essentially the average voltage of the input signals, and injecting that average (or a fraction of that average) into the variable resistor adjustment signal, the modulation of the resistance can be significantly reduced.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION

Figure 1:
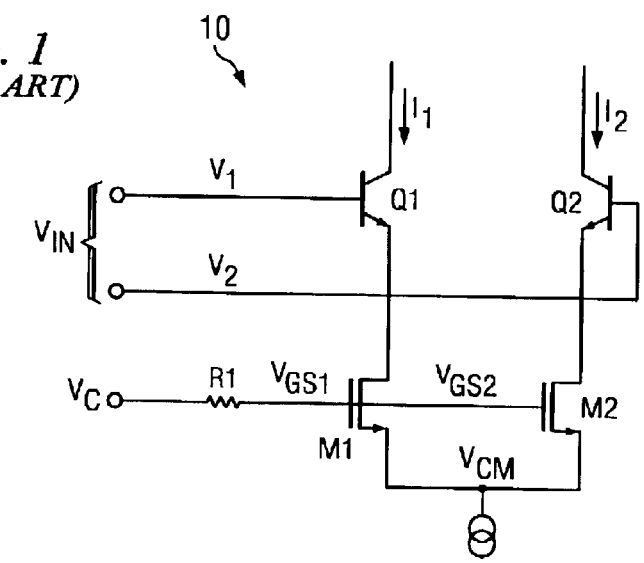
FIG. 1 is a simplified version of a prior art gain-controlled differential amplifier circuit.

FIG. 1 is a simplified diagram of the input stage of prior art gain-controlled differential amplifier 10. Input voltages at $V_{IN}$ (such as differential input voltages $V_1$ and $V_2$) are converted into currents I1 and I2. M1 and M2 are variable resistors where the resistance depends on the gate voltage for each device ($V_{GS1}$ and $V_{GS2}$, respectively). This voltage is equal to $V_C$ minus $V_{CM}$. Any input signal ($V_1$, $V_2$) imbalance coming into transistors Q1 and Q2 of circuit 10 translates to a voltage $V_{CM}$ that varies depending on the input voltage. As a result of this variation in the voltage $V_{CM}$, the voltage differential ($V_C - V_{CM}$) also varies, causing the resistance of M1 and M2 to change. This resistance change causes problems in the signal processing circuit, such as second order distortion.

As shown in FIG. 1, devices M1 and M2 are part of the degeneration network of the amplifier. When the input signal, $V_{IN}$, is balanced (i.e., $V1 = VIN$ (common mode)$+ V_d/2$ and $V_2 = V_{IN\ (common\ mode)} - V_d/2$, where $V_d = V_1 - V_2$ and $V_{IN\ (common\ mode)} = (V_1 + V_2)/2$), the common node, $V_{CM}$, is a virtual ground and there is an absence of an AC signal on $V_{CM}$. When devices M1 and M2 are biased with the DC voltage, their gate-to-source voltage, $V_{GS1}$ and $V_{GS2}$, are a constant DC voltage. However, when the input is unbalanced (e.g., $V_1 = V_{IN(common\ mode)} + V_{IN}$ and $V_2 = V_{IN(common\ mode)}$), $V_{CM}$ is no longer a virtual ground and there exists as AC signal on $V_{CM}$. Under the condition, a DC voltage at the gate of M1 and M2 results in an AC signal appearing between the gate and source of M1 and M2. Because the resistance emulated by M1 and M2 depends in $V_{GS1}$ and $V_{GS2}$, the degeneration resistance of the amplifier is modulated by the input signal. The modulation of the degeneration resistance is one of the contributing sources of second order distortion.

Figure 2:
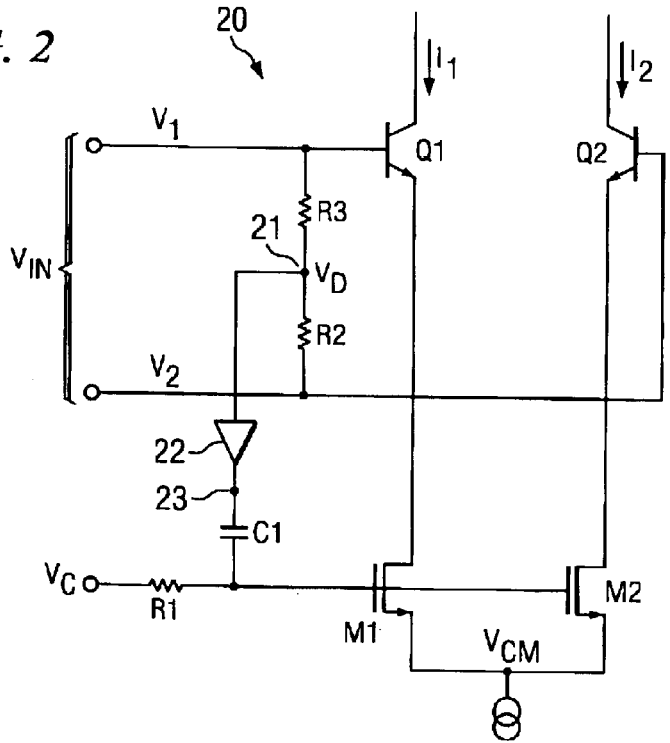
FIG. 2 is one embodiment of the invention providing a gain-controlled differential amplifier having second order distortions reduced.

Turning now to FIG. 2 where, in one embodiment, resistors R2 and R3 having common node 21 are added to circuit 20 providing a gain-controlled differential amplifier having second order distortion reduced according to an embodiment of the present invention. Voltage $V_D$ at point 21 at any point in time is halfway between input signal $V_1$ and input signal $V_2$. Voltage $V_D$ is buffered in the illustrated embodiment by circuit 22, which could be an amplifier, and by capacitor C1, and applied, along with gain adjustment signal $V_C$ (via resistor R1), to the input to variable resistors M1 and M2. Voltage $V_D$ is halfway between input $V_1$ and $V_2$ and thus counteracts the effect of the movement of voltage $V_{CM}$ such as to maintain resistive values M1 and M2 relatively constant even though unbalanced inputs to Q1 and Q2 changes the value of $V_{CM}$. By proper adjustment of the voltage at node 23 (by amplifier 22 or otherwise), the resistance values of M1 and M2 are held relatively unchanged and thus their distorting effect on further processing of the input signals is minimized. It is anticipated that this circuit will yield a 20 dB improvement in second order distortion performance.

In the single ended case where only one side of the input (for example $V_1$) is moving, and the other side ($V_2$) is staying at a fixed voltage, then in the conventional circuit of FIG. 1, the resistance of M1 would rise as $V_{CM}$ rises under control of transistor Q1. Thus, variable resistor M1 would then have a higher resistance than M2. Note that the value of M1 rose because the voltage at the base of transistor Q1 is different from the voltage across transistor Q2 because the input signal values are not equal to each other. However, by injecting the differential signal of node 23 of FIG. 2 into the variable resistor control signal, the difference between those resistances is reduced significantly. As it is the delta between those resistors that have been found to be a significant cause the second order distortion, the illustrated embodiment of the present invention operates to significantly reduce second order distortion.

It should be appreciated that the foregoing concept applies not just for a single ended case, but for other imbalances as well. The single-ended case is arguably the most extreme example when the problem is most severe because the inputs are completely unbalanced. If the inputs were perfectly differential, $V_{CM}$ would be constant as the signal swung back and forth. With any unbalance, $V_{CM}$ goes up and down at half the amplitude of the difference to the input signals, which in turn modulates the resistance of M1 and M2 which causes distortion.

In the embodiment above M1 and M2 are preferably FETs and Q1 and Q2 are NPN transistors, but they could be FETs or any other device or combination of devices configured to provide differential amplification. The value of components R2 and R3 are not critical, but they should be equal so as to provide the average of the two signals, thereby establishing the magnitude of voltage applied to the $V_{CM}$ node.

The differential voltage buffer, which comprises in the illustrated embodiment component 22, operates to minimize the amount of impact the use of this voltage has on the differential amplification circuit. If the resistance at node 21 were low this would impact the input impedance that is seen at $V_1$ and $V_2$. Accordingly, it is desired to have the impedance of the differential voltage circuit of this embodiment of the present invention at circuit 22 balanced.

$V_C$ is preferably controlled by a control block (not shown) that sets the resistance of M1 and M2, which then sets the gain for the differential input signal. This set value is what the average value of the gate voltage would need to be in order to control resistors M1 and M2. Embodiments of the present invention operate to inject an AC signal on top of this DC signal so that the common mode signal ($CV_1$, $V_2$) that appears at the input is added to the gate voltage that is applied to FETs M1 and M2. Capacitor C1 and Register $R_1$ effectively provide a pass characteristic where high frequencies are injected onto the gates of M1 and M2 while the DC value of that gate voltage is supplied by the external control circuitry, as discussed above. Another reason for the buffer is to isolate the input from the circuit by eliminating loading effects on the input.

It is often important to avoid using feedback for cancellation purposes. When feedback is used there is always the risk of having the circuit become unstable. The desire is to create only one path and that path is through the buffer forward to the gate control voltage. It should be appreciated that the illustrated embodiment of the present invention provides a differential voltage control circuit to mitigate second order distortion without the use of feedback.

In general, the illustrated embodiment injects the difference (delta) between the input voltages onto the gates of the FETs in order to reduce the modulation of the resistance. It should be appreciated that this delta can be obtained in different places according to embodiments of the present invention. For example, the difference can be obtained as voltages at the emitters of Q1 and Q2 which essentially track $V_1$ and $V_2$. The delta could be obtained by sensing the $V_{CM}$ voltage changes directly, which will also track the average between the two input voltages. The output signal could be sensed as well, although preferred embodiments do not implement feedback configurations.

It should be noted that while corrections for second order distortion have been discussed above, the concepts of the present invention minimize the effects of imbalance between signals and thus, by minimizing the effects of such imbalance in any type of circuit, improvement in circuit function will result.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. Circuitry for mitigating the effects of an imbalanced input, said circuitry comprising:
    sensing circuitry for providing at least one control signal, said control signal proportional to a sensed imbalance of said input; and
    circuitry for combining said control signal with an adjustment signal, said adjustment signal operative for modifying, at least in part, further processing of said input signal as a function of said sensed imbalance.

2. The circuitry of claim 1 wherein said adjustment signal is a DC signal.

3. The circuitry of claim 2 wherein said control signal is an AC signal.

4. The circuitry of claim 3 wherein said adjustment and control signals are voltage signals.

5. The circuitry of claim 1 wherein said adjustment signal comprises a gain adjustment signal.

6. The circuitry of claim 1 wherein said adjustment and control signals are applied to a gate of a FET device in order to reduce the modulation of the resistance used for said modifying of said further processing.

7. The circuitry of claim 1 wherein said further processing includes providing said imbalanced input to a differential amplifier.

8. The circuitry of claim 7 wherein said mitigating the effects of said imbalanced input by said circuitry reduces second order distortion in said differential amplifier.

9. The circuitry of claim 1 wherein said mitigating the effects of said imbalanced input by said circuitry reduces second order distortion in said further processing.

10. The circuitry of claim 1 wherein said imbalanced input is applied to an input of a variable gain differential amplifier having its gain controlled by resistive changes, which resistive changes are controlled by said adjustment signal.

11. The circuitry of claim 10 wherein said sensed imbalance is within said amplifier circuit.

12. The circuitry of claim 10 wherein said sensed imbalance is external to said amplifier circuit.

13. The circuitry of claim 1 wherein said imbalanced input arrives as a single signal and wherein a second signal is derived from said single signal thereby providing a pair of unbalanced signals.

14. A differential amplifier adapted to mitigate second order distortion, said amplifier comprising:
   circuitry for controlling at least one operational aspect of said amplifier in response to received adjustment signals; and
   circuitry for modifying said received adjustment signals based upon detected signal level differences between input signals to said differential amplifier.

15. The amplifier of claim 14 wherein said operational aspect of said amplifier comprises a gain of said amplifier.

16. The amplifier of claim 14 wherein said input signals are derived from a single-ended signal.

17. The amplifier of claim 14 wherein said input signals are differential signals.

18. The amplifier of claim 14 wherein said input signals are applied to the bases of bipolar transistors whose emitter voltages are each controlled, at least in part, by variable resistance values established by said operational aspect control circuitry.

19. The amplifier of claim 18 wherein said detected signal level difference is established by comparison of the AC voltage level difference between said input signals.

20. The amplifier of claim 19 wherein said received adjustment signal is a DC control voltage and wherein said comparison of AC voltage levels result in an AC error voltage, and wherein said modifying includes mixing said AC error voltage with said DC control voltage while isolating said DC control voltage from said input signals.

21. The amplifier of claim 20 wherein said input signal is a single-ended signal.

22. The amplifier of claim 20 wherein said modifying circuit includes resistive values connected to said input signals, said resistive values having a midpoint from which said AC error signal is obtained.

23. The amplifier of claim 22 further comprising proportionally reducing said error signal to a fraction of said voltage obtained from said resistive mid-point.

24. A system for reducing the effect on an electronic circuit caused by imbalances between input signals to said electronic circuit, said system comprising:
   means for continuously sensing said imbalances and for providing an imbalance signal proportional to said sensed imbalance; and
   means for adding said imbalance signal to a control signal utilized to control an operational aspect of said electronic circuit.

25. The system of claim 24, wherein said operational aspect comprises a gain of said electronic circuit.

26. The system of claim 24 wherein said electronic circuit comprises a differential gain-controlled amplifier, wherein said input signals are provided as input signals to said amplifier, and wherein said control signal comprises a gain control input of said amplifier.

27. The system of claim 26 wherein said gain control input is connected to a pair of transistors acting as variable resistors within said gain-controlled amplifier.

28. The system of claim 27 wherein said sensing means comprises an impedance bridge across said input signals.

29. The system of claim 27 wherein said imbalance signal comprises an AC signal and wherein said control signal comprises a DC signal.

30. A method for reducing the effect on an electronic circuit caused by imbalances between input signals to said electronic circuit, said method comprising:
   continuously sensing said imbalances;
   providing an imbalance signal proportional to said sensed imbalance; and
   adding said imbalance signal to a control signal utilized to control an operational aspect of said electronic circuit.

31. The method of claim 30 wherein said operational aspect comprises a gain of said electronic circuit.

32. The method of claim 30 wherein said electronic circuit comprises a differential gain-controlled amplifier, wherein said input signals are provided as input signals to said amplifier, and wherein said control signal comprises a gain control input of said amplifier.

33. The method of claim 32 wherein said gain control input is connected to a pair of transistors acting as variable resistors within said gain control circuit.

34. The method of claim 33 wherein said sensing means is an impedance bridge across said input signals.

35. The method of claim 33 wherein said sensing imbalance signals are AC signals and wherein said gain control signals are DC signals.

36. A method for controlling a differential amplifier, said method comprising:
   controlling an operational aspect of said amplifier in response to received adjustment signals; and
   modifying said received adjustment signals based upon detected signal level differences between input signals to said differential amplifier.

37. The method of claim 36 wherein said input signals are derived from a single-ended signal.

38. The method of claim 36 wherein said input signals are differential signals.

39. The method of claim 36 wherein said input signals are applied to the bases of transistors whose emitter voltages are each controlled by said received adjustment signals.

40. The method of claim 39 wherein said detected signal level difference is established by comparison of the AC voltage level difference between said input signals.

41. The method of claim 40 wherein said received adjustment signal is a DC control voltage and said comparison of AC voltage levels result in an AC error voltage, and wherein said modifying includes mixing said AC error voltage with said DC control voltage while isolating said DC control voltage from said input signals.

42. The method of claim 41 wherein said modifying circuit includes resistive values connected to said input signals, said resistive values having a midpoint from which said AC error signal is obtained.

43. The method of claim 42 further comprising proportionally reducing said error signal to a fraction of said voltage obtained from said resistive mid-point.

44. The method of claim 36 wherein said operational aspect comprises a gain of said amplifier.

45. A method for mitigating effects of imbalanced input signals, said method comprising:
   providing at least one control signal, said control signal proportional to a sensed imbalance between said input signals; and
   combining said control signal with an adjustment signal, said adjustment signal operative for modifying, at least in part, further processing of said input signals.

46. The method of claim 45 wherein said adjustment signal is a DC signal.

47. The method of claim 46 wherein said control signal is an AC signal.

48. The method of claim 47 wherein said adjustment and control signals are applied to a gate of a FET device in order to reduce the modulation of the resistance used for said modifying of said further processing.

49. The method of claim 48 wherein said further processing includes providing said unbalanced input signals to a differential amplifier.

50. The method of claim 49 wherein said mitigation of effects of said imbalanced input signals reduces second order distortion in said differential amplifier.

51. The method of claim 45 wherein said mitigation of effects of said imbalanced input signals reduces second order distortion in said further processing.

52. The method of claim 45 wherein said imbalanced input signals are each applied to an input of a variable gain differential amplifier having its gain controlled by resistive changes, which resistive changes are controlled by said adjustment signal.

53. The method of claim 52 wherein said sensed imbalance is within said amplifier circuit.

54. The method of claim 52 wherein said sensed imbalance is external to said amplifier circuit.

55. The method of claim 45 wherein said unbalanced signal arrives as a single signal and wherein a second is derived from said single signal thereby providing said unbalanced signals.

56. Circuitry for mitigating distortion associated with input signals which arrive unbalanced at a differential amplifier, said circuitry comprising:
  means for providing at least one control signal, said control signal proportional to a sensed imbalance between said input signals; and
  means for combining said control signal with a gain adjustment signal, said gain adjustment signal operative for modifying, at least in part, further processing of said input signals.

57. The circuitry of claim 56 wherein said gain adjustment signal is a DC signal.

58. The circuitry of claim 57 wherein said control signal is an AC signal.

59. The circuitry of claim 56 wherein said adjustment and control signals are applied to a gate of a FET device in order to reduce the modulation of the resistance used for said modifying of said further processing.

60. The circuitry of claim 56 wherein said further processing includes means for providing said unbalanced input signals to a differential amplifier.

61. The circuitry of claim 60 wherein said mitigating distortion associated with said input signals reduces second order distortion in said differential amplifier.

62. The circuitry of claim 56 wherein said mitigating distortion associated with said input signals reduces second order distortion in said further processing.

63. The circuitry of claim 56 wherein said unbalanced input signals arc each applied to an input of a variable gain differential amplifier having its gain controlled by resistive changes, which resistive changes are controlled by said gain adjustment signal.

64. The circuitry of claim 63 wherein said sensed unbalance is within said amplifier circuit.

65. The circuitry of claim 63 wherein said sensed unbalance is external to said amplifier circuit.

66. The circuitry of claim 56 wherein said unbalanced signal arrives as a single signal and wherein said circuitry includes means for deriving a second signal from said single signal thereby providing said unbalanced signals.

* * * * *